United States Patent
Hayashi et al.

(10) Patent No.: US 9,097,976 B2
(45) Date of Patent: Aug. 4, 2015

(54) REFLECTIVE MASK BLANK FOR EUV LITHOGRAPHY

(71) Applicant: ASAHI GLASS COMPANY, LIMITED, Chiyoda-ku (JP)

(72) Inventors: Kazuyuki Hayashi, Chiyoda-ku (JP); Kazunobu Maeshige, Chiyoda-ku (JP); Toshiyuki Uno, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 194 days.

(21) Appl. No.: 13/956,691

(22) Filed: Aug. 1, 2013

(65) Prior Publication Data

US 2013/0316272 A1     Nov. 28, 2013

Related U.S. Application Data

(63) Continuation of application No. PCT/JP2012/052012, filed on Jan. 30, 2012.

(30) Foreign Application Priority Data

Feb. 1, 2011 (JP) .................................. 2011-019391

(51) Int. Cl.
*G03F 1/24* (2012.01)
*G03F 1/54* (2012.01)
*G03F 1/80* (2012.01)

(52) U.S. Cl.
CPC .. *G03F 1/24* (2013.01); *G03F 1/54* (2013.01); *G03F 1/80* (2013.01)

(58) Field of Classification Search
CPC ..................................... G03F 1/22; G03F 1/24
USPC ............................................................. 430/5
See application file for complete search history.

(56) References Cited

U.S. PATENT DOCUMENTS 7,713,666 B2   5/2010   Hayashi et al.
7,718,324 B2   5/2010   Hayashi et al.
(Continued)

FOREIGN PATENT DOCUMENTS

JP   2005-268255   9/2005
JP   2007-250613   9/2007
(Continued)

OTHER PUBLICATIONS

U.S. Appl. No. 13/775,412, filed Feb. 25, 2013, Hayashi.
(Continued)

*Primary Examiner* — Stephen Rosasco
(74) *Attorney, Agent, or Firm* — Oblon, McClelland, Maier & Neustadt, L.L.P.

(57) ABSTRACT

To provide an EUV mask blank with which the etching selectivity under etching conditions for absorber layer is sufficiently high, line edge roughness after pattern formation will not be large, and a pattern with high resolution can be obtained.

A reflective mask blank for EUV lithography comprising a substrate, and a reflective layer for reflecting EUV light, an absorber layer for absorbing EUV light and a hard mask layer formed in this order on the substrate;
  wherein the absorber layer contains at least one of tantalum (Ta) and palladium (Pd) as the main component;
  the hard mask layer contains chromium (Cr), either one of nitrogen (N) and oxygen (O) and hydrogen (H); and
  in the hard mask layer, the total content of Cr and either one of N and O is from 85 to 99.9 at %, and the content of H is from 0.1 to 15 at %.

20 Claims, 2 Drawing Sheets

(56) References Cited

U.S. PATENT DOCUMENTS

| | | |
|---|---|---|
| 7,833,682 B2 | 11/2010 | Hayashi et al. |
| 7,855,036 B2 | 12/2010 | Hayashi et al. |
| 7,906,259 B2 | 3/2011 | Hayashi et al. |
| 7,981,573 B2 | 7/2011 | Ishibashi et al. |
| 8,029,950 B2 | 10/2011 | Hayashi et al. |
| 8,168,352 B2 | 5/2012 | Hayashi et al. |
| 8,227,152 B2 | 7/2012 | Hayashi |
| 8,288,062 B2 | 10/2012 | Hayashi et al. |
| 2006/0251973 A1 | 11/2006 | Takaki et al. |
| 2008/0318139 A1 | 12/2008 | Dersch et al. |
| 2010/0035165 A1 | 2/2010 | Hayashi et al. |
| 2010/0266938 A1 | 10/2010 | Hosoya |
| 2011/0070534 A1 | 3/2011 | Hayashi |
| 2011/0171566 A1 | 7/2011 | Hayashi |
| 2012/0322000 A1 | 12/2012 | Uno et al. |
| 2013/0196255 A1 | 8/2013 | Hayashi |

FOREIGN PATENT DOCUMENTS

| | | |
|---|---|---|
| JP | 2007-273514 | 10/2007 |
| JP | 2008-72127 | 3/2008 |
| JP | 2008-78551 | 4/2008 |
| JP | 2008-116583 | 5/2008 |
| JP | 2009-21582 | 1/2009 |
| JP | 2009-54899 | 3/2009 |
| JP | 2009-210802 | 9/2009 |
| JP | 2010-206156 | 9/2010 |
| JP | 2011-112982 | 6/2011 |
| WO | 2011/004850 | 1/2011 |
| WO | 2011/030521 | 3/2011 |

OTHER PUBLICATIONS

U.S. Appl. No. 13/956,898, filed Aug. 1, 2013, Maeshige, et al.
International Search Report issued May 1, 2012 in PCT/JP2012/052012 filed Jan. 30, 2012.

REFLECTIVE MASK BLANK FOR EUV LITHOGRAPHY

TECHNICAL FIELD

The present invention relates to a reflective mask blank for EUV (Extreme Ultra Violet) lithography (in this specification, hereinafter also referred to as "EUV mask blank") to be used for e.g. production of semiconductors.

BACKGROUND OF INVENTION

Heretofore, in the semiconductor industry, a photolithography method employing visible light or ultraviolet light has been used as a technique to transfer a fine pattern required to form an integrated circuit of a fine pattern on e.g. a Si substrate. However, the conventional photolithography method has come close to its limit, while miniaturization of semiconductor devices has been accelerated. In the case of the photolithography method, the resolution limit of a pattern is about ½, of the exposure wavelength. Even if an immersion method is employed, the resolution limit is said to be about ¼, of the exposure wavelength, and even if an immersion method of ArF laser (wavelength: 193, nm) is employed, about 45, nm is presumed to be the limit of the exposure wavelength. From this point of view, EUV lithography, which is an exposure technique employing EUV light having a wavelength further shorter than ArF laser, is expected to be prospective as a next generation exposure technique for 45, nm or below. In this specification, EUV light means a light ray having a wavelength within a soft X-ray region or within a vacuum ultraviolet region, specifically a light ray having a wavelength of from about 10, to 20, nm, particularly about 13.5, nm±0.3, nm.

EUV light is likely to be absorbed by all kinds of substances, and the refractive indices of substances at such a wavelength are close to 1,, whereby it is not possible to use a conventional dioptric system like photolithography employing visible light or ultraviolet light. For this reason, for EUV lithography, a catoptric system, i.e. a reflective photomask and a mirror, is employed.

A mask blank is a stacked structure for production of a photomask, which has not been patterned yet.

In the case of an EUV mask blank, it has a structure wherein a reflective layer for reflecting EUV light and an absorber layer for absorbing EUV light, are formed in this order on a substrate made of e.g. glass. On the absorber layer, as a case requires, a low reflective layer for pattern inspection wavelength (from 190, to 260, nm) is formed. As the absorber layer, a material having a high extinction coefficient for EUV light, specifically, for example, a material having Ta as the main component, is used. As the low reflective layer, a material having low reflection properties for pattern inspection wavelength, specifically, a material containing Ta and O as the main components is used.

To produce a photomask from the mask blank of the above structure, a resist film is applied on the uppermost layer (the absorber layer, or in a case where a low reflective layer is formed on the absorber layer, the low reflective layer) of the mask blank. On the resist film, a pattern is formed by an electron beam lithography apparatus, and then using the resist film having a pattern formed thereon as a mask, an etching process is carried out, whereby the pattern is transferred to the absorber layer (in a case where a low reflective layer is formed on the absorber layer, the absorber layer and the low reflective layer). Here, since the resist film is also consumed in the etching process, the resist film should be sufficiently thick. The thickness of the resist is usually at a level of 150, nm although it depends on the type of the resist and the etching conditions.

In recent years, while miniaturization and high densification of the pattern are in progress, a pattern with a higher resolution has been required, and in order to obtain a pattern with a high resolution, the resist film is required to be thin.

However, if the resist film is made thin, since the resist film is consumed in the etching process, the accuracy of the pattern transferred to the absorber layer (in a case where a low reflective layer is formed on the absorber layer, the absorber layer and the low reflective layer) may be lowered.

To overcome the above problem, it has been commonly known that the resist film can be made thin by providing a layer (hard mask layer) made of a material having resistance to the etching conditions for the absorber layer (in a case where a low reflective layer is formed on the absorber layer, the absorber layer and the low reflective layer) (Patent Documents 1, and 2). That is, the resist film can be made thin by forming such a hard mask layer to increase the etching selectivity of the absorber layer (in a case where a low reflective layer is formed on the absorber layer, the absorber layer and the low reflective layer) to the hard mask layer under etching conditions for absorber layer (in a case where a low reflective layer is formed on the absorber layer, the absorber layer and the low reflective layer), specifically, the ratio of the etching rate for the absorber layer (in a case where a low reflective layer is formed on the absorber layer, the etching rate for the absorber layer and the low reflective layer) to the etching rate for the hard mask layer under etching conditions for absorber layer (in a case where a low reflective layer is formed on the absorber layer, the absorber layer and the low reflective layer).

Hereinafter in this specification, "the etching selectivity under etching conditions for absorber layer" means the etching selectivity of the absorber layer (in a case where a low reflective layer is formed on the absorber layer, the absorber layer and the low reflective layer) to the hard mask layer under etching conditions for absorber layer (in a case where a low reflective layer is formed on the absorber layer, the absorber layer and the low reflective layer), and the etching selectivity can be determined by the following formula:

Etching selectivity=(the etching rate for the absorber layer (in a case where a low reflective layer is formed on the absorber layer, the etching rate for the absorber layer and the low reflective layer))/ (the etching rate for the hard mask layer)

Patent Document 1, discloses that a material containing chromium (Cr), zirconium (Zr) or indium (In) as the main component is preferred as a material constituting the hard mask layer, whereby obtainable hard mask has high etching resistance to fluorine type gas plasma to be used for etching of a light absorber layer (absorber layer) containing Ta as the main component, and it can readily be etched by means of chlorine type gas plasma.

Patent document 2, discloses that a layer containing any of silicon, oxygen, carbon and chromium is preferred as a hard mask layer, which has high etching resistance in a dry etching process based on fluorine.

PRIOR ART DOCUMENTS

Patent Documents

Patent Document 1:, JP-A-2009-54899
Patent Document 2:, JP-A-2009-21582

DISCLOSURE OF INVENTION

Technical Problem

As described above, the resist film can be made thin by providing, on the absorber layer (in a case where a low reflective layer is formed on the absorber layer, the low reflective layer), a hard mask layer of a material which increases the etching selectivity under etching conditions for the absorber layer.

However, to obtain a pattern with a high resolution, only a high etching selectivity under etching conditions for the absorber layer is insufficient as properties necessary for the hard mask layer, and the present inventors have found that the properties of the hard mask layer, specifically, the crystalline state of the hard mask layer (that is, whether it is a film having a crystalline structure or an amorphous film) and the surface roughness are also important.

That is, in a case where the hard mask layer is a film having a crystalline structure or a film having a large surface roughness, it is predicted that the line edge roughness after formation of the pattern tends to be large, whereby no pattern with a high resolution will be obtained. Accordingly, the present inventors have found that the hard mask layer preferably has a high etching selectivity under etching conditions for the absorber layer, is in an amorphous state and has a sufficiently small surface roughness.

Each of Patent Documents 1, and 2, discloses the composition of the hard mask layer i.e. the main component constituting the hard mask layer, but failed to disclose and consider the crystalline state and the surface roughness of the hard mask layer. Further, depending on the composition of the hard mask layer, specifically, the proportion of the components constituting the hard mask layer and components other than the main component, it is considered that the hard mask layer is a film having a crystalline structure or a film having a large surface roughness.

To solve the problems of prior art, the object of the present invention is to provide an EUV mask blank with a sufficiently high etching selectivity under etching conditions for the absorber layer or for the absorber layer and the low reflective layer, with which the line edge roughness after formation of a pattern will not be large, and with which a pattern with a high resolution can be obtained.

Solution to Problem

The present inventors have conducted extensive studies to achieve the above object and as a result, they have found that in a mask blank having an absorber layer containing at least one of tantalum (Ta) and palladium (Pd) as the main component, or in a mask blank having an absorber layer containing at least one of tantalum (Ta) and palladium (Pd) as the main component, further having a low reflective layer containing at least one of tantalum (Ta) and palladium (Pd), and oxygen (O), as the main components, formed on the absorber layer, by forming a film containing Cr, either one of N and O, and H, in a specific proportion (a CrNH film or a CrOH film) as the hard mask layer to be formed on the absorber layer (in a case where the low reflective layer is formed on the absorber layer, on the low reflective layer), the etching selectivity under etching conditions for the absorber layer is sufficiently high, the hard coat layer is in an amorphous state, and its surface roughness is sufficiently small.

The present invention has been accomplished on the basis of the above discovery, and provides a reflective mask blank for EUV lithography comprising a substrate, and a reflective layer for reflecting EUV light, an absorber layer for absorbing EUV light and a hard mask layer formed in this order on the substrate;
wherein the absorber layer contains at least one of tantalum (Ta) and palladium (Pd) as the main component;
the hard mask layer contains chromium (Cr), nitrogen (N) and hydrogen (H); and
in the hard mask layer, the total content of Cr and N is from 85, to 99.9, atomic % (hereinafter atomic % will be referred to as at %), and the content of H is from 0.1, to 15 at %.

The present invention further provides a reflective mask blank for EUV lithography comprising a substrate, and a reflective layer for reflecting EUV light, an absorber layer for absorbing EUV light, a low reflective layer for inspection light (wavelength:190, to 260, nm) for a mask pattern, and a hard mask layer formed in this order on the substrate;
wherein the absorber layer contains at least one of tantalum (Ta) and palladium (Pd) as the main component;
the low reflective layer contains at least one of tantalum (Ta) and palladium (Pd), and oxygen (O), as the main components;
the hard mask layer contains chromium (Cr), nitrogen (N) and hydrogen (H); and
in the hard mask layer, the total content of Cr and N is from 85, to 99.9, at %, and the content of H is from 0.1, to 15, at %.

It is preferred that in the hard mask layer containing Cr, N and H, the compositional ratio (atomic ratio) of Cr to N is Cr:N=9:1, to 3:7.

It is preferred that the hard mask layer containing Cr, N and H is formed by a sputtering method using a Cr target in an atmosphere containing an inert gas including at least one member selected from the group consisting of helium (He), argon (Ar), neon (Ne), krypton (Kr) and xenon (Xe), and nitrogen ($N_2$) and hydrogen ($H_2$).

The present invention further provides a reflective mask blank for EUV lithography comprising a substrate, and a reflective layer for reflecting EUV light, an absorber layer for absorbing EUV light and a hard mask layer formed in this order on the substrate;
wherein the absorber layer contains at least one of tantalum (Ta) and palladium (Pd) as the main component;
the hard mask layer contains chromium (Cr), oxygen (O) and hydrogen (H); and
in the hard mask layer, the total content of Cr and O is from 85, to 99.9, at %, and the content of H is from 0.1, to 15, at %.

The present invention further provides a reflective mask blank for EUV lithography comprising a substrate, and a reflective layer for reflecting EUV light, an absorber layer for absorbing EUV light, a low reflective layer for inspection light (wavelength:190, to 260, nm) for a mask pattern, and a hard mask layer formed in this order on the substrate;
wherein the absorber layer contains at least one of tantalum (Ta) and palladium (Pd) as the main component;
the low reflective layer contains at least one of tantalum (Ta) and palladium (Pd), and oxygen (O), as the main components;
the hard mask layer contains chromium (Cr), oxygen (O) and hydrogen (H); and in the hard mask layer, the total content of Cr and O is from 85, to 99.9, at %, and the content of H is from 0.1, to 15, at %.

It is preferred that in the hard mask layer containing Cr, O and H, the compositional ratio (atomic ratio) of Cr to O is Cr:O=9:1, to 3:7.

It is preferred that the hard mask layer containing Cr, O and H is formed by a sputtering method using a Cr target in an atmosphere containing an inert gas including at least one member selected from the group consisting of helium (He), argon (Ar), neon (Ne), krypton (Kr) and xenon (Xe), and oxygen ($O_2$) and hydrogen ($H_2$).

In the EUV mask blank of the present invention, it is preferred that the hard mask layer is in an amorphous state.

In the EUV mask blank of the present invention, it is preferred that the surface roughness (rms) of the surface of the hard mask layer is at most 0.5, nm.

In the EUV mask blank of the present invention, it is preferred that the hard mask layer has a film thickness of from 2, to 30, nm.

In the EUV mask blank of the present invention, between the reflective layer and the absorber layer, a protection layer to protect the reflective layer at the time of forming a pattern on the absorber layer may be formed, and in such a case, the protection layer is formed by at least one member selected from the group consisting of Ru, a Ru compound, $SiO_2$, and a Cr compound.

In this specification, "to" used to show the range of the numerical values is used to include the numerical values before and after it as the lower limit value and the upper limit value, and unless otherwise specified, the same applies hereinafter.

Advantages Effects of Invention

With the EUV mask blank of the present invention, of which the etching selectivity under etching conditions for the absorber layer or for the absorber layer and the low reflective layer is sufficiently high, the reduction in the thickness of the resist film required to obtain a pattern with a high resolution can be achieved.

Further, since the hard mask layer is in an amorphous state and has a sufficiently small surface roughness, the line edge roughness after formation of a pattern will not be large, and a pattern with a high resolution can be obtained.

DESCRIPTION OF EMBODIMENTS

In the following, the EUV mask blank of the present invention will be described with reference to drawings.

Figure 1:
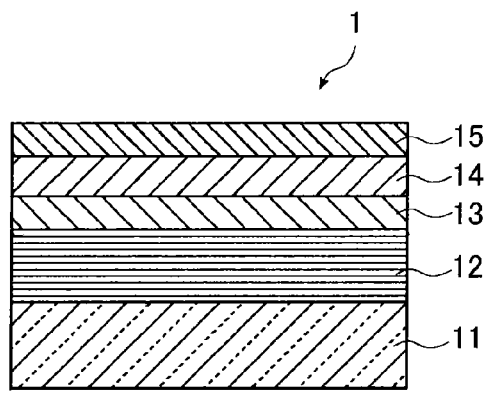
FIG. 1 is a cross-sectional view schematically illustrating an embodiment of an EUV mask blank of the present invention.

FIG. 1 is a cross-sectional view schematically illustrating an embodiment of the EUV mask blank of the present invention. The mask blank 1 shown in FIG. 1 comprises a substrate 11, and a reflective layer 12 for reflecting EUV light, an absorber layer 13 for absorbing EUV light, a low reflective layer 14 for inspection light to be used for inspection of a mask pattern and a hard mask layer 15 formed in this order on the substrate 11. It should be noted, however, that in the EUV mask blank of the present invention, only the substrate 11, the reflective layer 12, the absorber layer 13 and the hard mask layer 15 are essential in the construction shown in FIG. 1, and the low reflective layer 14 is an optional constituent. Further, between the reflective layer 12 and the absorber layer 13, a protection layer may be formed. The protection layer here means a layer to be provided for the purpose of protecting the reflective layer 12 at the time of forming a pattern on the absorber layer (in the case of the shown EUV mask blank 1, the absorber layer 13 and the low reflective layer 14).

Now, the respective constituents in the mask blank 1 will be described.

The substrate 11 is required to satisfy the properties that a substrate of an EUV mask blank should possess. Accordingly, the substrate 11 is required to have a low thermal expansion coefficient, specifically, it preferably has a thermal expansion coefficient of $0\pm0.05\times10^{-7}/°$ C., particularly preferably $0\pm0.03\times10^{-7}/°$ C., at 20° C. Further, the substrate is preferably excellent in smoothness, flatness and resistance to a cleaning liquid used for cleaning the mask blank or the photomask after formation of a pattern. As the substrate 11, specifically, glass having a low thermal expansion coefficient such as $SiO_2$—$TiO_2$, glass may be used. However, it is not limited to such glass, but a substrate of crystallized glass having a β quartz solid solution precipitated, quartz glass, silicon, a metal or the like may also be employed.

The substrate 11 preferably has a smooth surface having a surface roughness (rms) of at most 0.15, nm and a flatness of at most 100, nm, for the purpose of obtaining a high reflectivity and a high transfer accuracy in a photomask after formation of a pattern.

The size, the thickness, etc. of the substrate 11 are appropriately determined depending on the design values of the mask. In Examples described later, $SiO_2$—$TiO_2$ glass having an external size of about 6, inch (152, mm) square and a thickness of about 0.25, inch (6.3, mm) was used.

It is preferred that no defect is present on a surface of the substrate 11 on which the reflective layer 12 is to be formed. However, even if defects are present, in order to prevent formation of phase defects due to concave defects and/or convex defects, the depth of such concave defects and the height of such convex defects are preferably at most 2, nm, and the half width of the size of such concave defects and convex defects is preferably at most 60, nm.

The reflective layer 12 is not particularly limited so long as it has desired properties as a reflective layer of an EUV mask blank. Here, the properties particularly required for the reflective layer 12 is having a high EUV light reflectivity. Specifically, when the surface of the reflective layer 12 is irradiated with light at a wavelength region of EUV light at an incident angle of 6, degrees, the maximum value of the light reflectivity at a wavelength in the vicinity of 13.5, nm is preferably at least 60%, more preferably at least 65%. Further, even in a case where a protection layer is provided on the reflective layer 12, the maximum value of the light reflectivity at a wavelength in the vicinity of 13.5, nm is preferably at least 60%, more preferably at least 65%.

As the reflective layer 12, a multilayer reflective film having a plurality of high refractive index layers and low refractive index layers alternately stacked is usually employed with a view to achieving high EUV light reflectivity. In the multilayer reflective film composing the reflective layer 12, Si is widely used for the high refractive index layers, and Mo is widely used for the low refractive index layers. That is, a Mo/Si multilayer reflective film (a multilayer reflective layer having a plurality of Mo layers and Si layers alternately stacked) is the most common. However, the multilayer reflective film is not limited thereto, and for example, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film may also be employed.

The film thickness of each layer and the number of repeating units of the layers constituting the multilayer reflective film composing the reflective layer 12, may be appropriately selected according to the film material to be used and the EUV light reflectivity required for the reflective layer. In a case of Mo/Si reflective film, for example, a reflective layer 12 having a maximum value of EUV light reflectivity of at least 60% may be obtained by depositing a multilayer reflective film wherein a Mo layer having a thickness of 2.3±0.1, nm and a Si layer having a thickness of 4.5±0.1, nm are alternately stacked so that the number of repeating units becomes from 30, to 60.

Here, layers constituting the multilayer reflective film composing the reflective layer 12 may be each film-formed by a known film-deposition method such as a magnetron sputtering method or an ion beam sputtering method so as to have a desired thickness. For example, in a case of depositing a Mo/Si multilayer reflective film by using an ion beam sputtering method, it is preferred that a Si film is deposited by using a Si target as a target and Ar gas (gas pressure: $1.3 \times 10^{-2}$, Pa to $2.7 \times 10^{-2}$, Pa) as a sputtering gas under an ion acceleration voltage of from 300, to 1,500, V at a deposition rate of from 0.03, to 0.30, nm/sec so as to have a thickness of 4.5, nm, and subsequently a Mo film is deposited by using a Mo target as a target and Ar gas (gas pressure: $1.3 \times 10^{-2}$, Pa to $2.7 \times 10^{-2}$, Pa) as a sputtering gas under an ion acceleration voltage of from 300, to 1,500, V at a deposition rate of from 0.03, to 0.30, nm/sec so as to have a thickness of 2.3, nm. Taking the above process as one cycle, from 30, to 60 cycles of deposition of a Si film and a Mo film are carried out to form a Mo/Si multilayer reflective film.

In order to prevent oxidization of a surface of the reflective layer 12, the uppermost layer of the multilayer reflective film composing the reflective layer 12 is preferably a layer made of a material hard to be oxidized. The layer made of a material hard to be oxidized functions as a cap layer of the reflective layer 12. As a specific example of the layer made of a material hard to be oxidized functioning as a cap layer, a Si layer may be mentioned. When the multilayer reflective film composing the reflective layer 12 is a Mo/Si film, by providing a Si layer as the uppermost layer, it is possible to allow the uppermost layer to function as a cap layer. In this case, the film thickness of the cap layer is preferably 11±2, nm.

As described above, a protection layer may be formed between the reflective layer 12 and the absorber layer 13. The protection layer is provided for the purpose of protecting the reflective layer 12 so that the reflective layer 12 is not damaged by etching at the time of forming a mask pattern on the absorber layer 13 by etching, usually dry etching. Accordingly, as the material of the protection layer, a material that is less susceptible to etching of the absorber layer 13, that is, a material having an etching rate lower than that for the absorber layer 13 and being hard to be damaged by the etching, is used. As a material satisfying such a condition, Cr, Al, Ta or a nitride thereof, Ru and a Ru compound (RuB, RuSi, etc.), or $SiO_2$, $Si_3N_4$, $Al_2O_3$, or a mixture thereof may, for example, be mentioned. Among them, Ru and a Ru compound (RuB, RuSi, etc.), CrN and $SiO_2$, are preferred, and Ru and a Ru compound (RuB, RuSi, etc.) are particularly preferred.

The thickness of the protection layer is preferably from 1, to 60, nm.

The protection layer is formed by using a known film-deposition method such as a magnetron sputtering method or an ion beam sputtering method. In a case of depositing Ru film by a magnetron sputtering method, the film is preferably deposited by using a Ru target as a target and Ar gas (gas pressure: $1.0 \times 10^{-2}$, Pa to $10 \times 10^{-1}$, Pa) as a sputtering gas with an input power of from 30, to 1,500, V at a deposition rate of from 0.02, to 1.0, nm/sec so as to have a thickness of from 2, to 5, nm.

The properties particularly required for the absorber layer 13 are such that the EUV light reflectivity is particularly low. Specifically, the maximum light reflectivity at a wavelength in the vicinity of 13.5, nm when the surface of the absorber layer 13 is irradiated with a light at a wavelength range of EUV light is preferably at most 0.5%, more preferably at most 0.1%.

In the EUV mask blank 1 of the present invention, also when the surface of the low reflective layer 14 is irradiated with a light at a wavelength range of EUV light, the maximum light reflectivity at a wavelength in the vicinity of 13.5, nm is preferably at most 0.5%, more preferably at most 0.1%.

To achieve the above, the absorber layer 13 is constituted by a material having a high extinction coefficient for EUV light. For the EUV mask blank 1 of the present invention, as the material having a high extinction coefficient for EUV light constituting the absorber layer 13, a material containing at least one of tantalum (Ta) and palladium (Pd) as the main component is used. In this specification, a material containing at least one of tantalum (Ta) and palladium (Pd) as the main component means a material containing at least 40, at %, preferably at least 50, at %, more preferably at least 55, at % of at least one of Ta and Pd. Here, the material may contain both of Ta and Pd, and TaPd may be exemplified.

The material containing at least one of Ta and Pd as the main component to be used for the absorber layer 13 may contain, in addition to Ta or Pd, at least one element selected from the group consisting of hafnium (Hf), silicon (Si), zirconium (Zr), germanium (Ge), boron (B), nitrogen (N) and hydrogen (H). Specific examples of a material containing the above element in addition to Ta or Pd include TaN, TaNH, PdN, PdNH, TaPdN, TaPdNH, TaHf, TaHfN, TaBSi, TaBSiH, TaBSiN, TaBSiNH, TaB, TaBH, TaBN, TaBNH, TaSi, TaSiN, TaGe, TaGeN, TaZr and TaZrN.

Among them, TaNH is preferred, whereby the absorber layer is in an amorphous state, and the surface of the absorber layer tends to have excellent smoothness.

Further, TaPd, TaPdN or TaPdNH is preferred, since not only the absorber layer is an amorphous state but also it has a low refractive index and a desired extinction coefficient, whereby the absorber layer can be made thin.

In this specification, the state represented by "being in amorphous state" will be described later.

The absorber layer 13 having the above constitution may be formed by a known film-deposition method, e.g. a magnetron sputtering method or an ion beam sputtering method.

For example, in a case of forming a TaNH film by a magnetron sputtering method as the absorber layer 13, it is preferred that a TaNH film is deposited by using a Ta target as a target and a mixed gas of Ar, $N_2$, and $H_2$, ($H_2$, gas concentration: 1, to 50 vol %, $N_2$, gas concentration: 1, to 80, vol %, Ar gas concentration: 5, to 95, vol %, gas pressure: $1.0 \times 10^{-1}$, Pa to $50 \times 10^{-1}$, Pa) as a sputtering gas with an input power of from 30, to 3,000, W at a deposition rate of from 0.5, to 60, nm/min so as to have a thickness of from 10, to 80, nm.

Further, in the case of forming a TaPdN film by a magnetron sputtering method as the absorber layer 13, it is preferred that a TaPdN film is deposited by using a Ta target and a Pd target, or a compound target containing Ta and Pd, as a target, and a mixed gas of Ar and $N_2$, ($N_2$, gas concentration: 1, to 80, vol %, Ar gas concentration: 5, to 95, vol %, gas pressure: $1.0\times10^{-1}$, Pa to $50\times10^{-1}$, Pa) with an input power of from 30, to 1,000, W at a deposition rate of from 0.5, to 60, nm/min so as to have a thickness of from 20, to 50, nm.

In a case where an inert gas other than Ar is used, the concentration of the inert gas is preferably set to be within the same concentration range as the Ar gas concentration. Further, in a case where a plurality of types of inert gases is used, the total concentration of the inert gases is preferably set to be within the same concentration range as the above Ar gas concentration.

The film thickness of the absorber layer 13 is set so that the total film thickness of the absorber layer 13 and the low reflective layer 14 is preferably from 10, to 90, nm, more preferably from 15, to 87, nm, further preferably from 15, to 85, nm.

The low reflective layer 14 is composed of a film which is low reflective for inspection light to be used for inspection of a mask pattern. At the time of preparation of an EUV mask, after a pattern is formed on the absorber layer, the EUV mask is inspected whether the pattern is formed as designed. For inspection of the mask pattern, an inspection machine usually employing a light at a wavelength of from about 190, to 260, nm as inspection light is used. That is, the EUV mask is inspected by the difference in the reflectivity for this light at a wavelength of from about 190, to 260, nm, specifically by the difference in the reflectivity between on the exposed face from which the absorber layer 13 is removed by pattern formation and on the surface of the absorber layer 13 remaining without being removed by pattern formation. The former face corresponds to the surface of the reflective layer 12, and in a case where the protection layer is formed on the reflective layer 12, the surface of the protection layer. Thus, if the difference in the reflectivity between on the surface of the reflective layer 12 (in a case where the protection layer is formed on the reflective layer 12, the surface of the protection layer) and on the surface of the absorber layer 13 for light at a wavelength of the inspection light is small, the contrast tends to be poor at the time of inspection and accurate inspection will not be conducted.

The absorber layer 13 having the above-described construction has a very low EUV light reflectivity and has excellent properties as the absorber layer for the EUV mask blank 1, but with respect to the wavelength of the inspection light, its light reflectivity is not necessarily sufficiently low. Thus, the difference between the reflectivity on the surface of the absorber layer 13 and the reflectivity on the surface of the reflective layer 12 (in a case where the protection layer is formed on the reflective layer 12, the surface of the protection layer) at a wavelength of the inspection light is small, and no sufficient contrast may be obtained at the time of inspection. If no sufficient contrast can be obtained at the time of inspection, defects of the pattern cannot sufficiently be judged at the time of mask inspection, and the defect test cannot be conducted accurately.

In the EUV mask blank 1 of the present invention, by forming a low reflective layer 14 for inspection light on the absorber layer 13, the light reflectivity at the wavelength of the inspection light becomes very low, and a good contrast will be obtained at the time of inspection.

The low reflective layer 14 is preferably made of a material having a lower refractive index at a wavelength of the inspection light than that of the absorber layer 13, and it is preferably in an amorphous state, in order to achieve the above properties.

In order to achieve the above properties, for the EUV mask blank 1 of the present invention, as a material constituting the low reflective layer 14, a material containing at least one of tantalum (Ta) and palladium (Pd), and oxygen (O), as the main components, is used. In the present invention, the material containing at least one of Ta and Pd, and O, as the main components, means a material containing at least 40 at %, preferably at least 50, at %, more preferably at least 55, at % of at least one of Ta and Pd, and O in total, and as a material containing at least one of Ta and Pd, and O, TaO and PdO may be exemplified. Further, the material may contain both of Ta and Pd, and TaPdO may be exemplified.

The material containing at least one of Ta and Pd, and O, as the main components, to be used for the low reflective layer 14 may contain at least one element selected from the group consisting of hafnium (Hf), silicon (Si), zirconium (Zr), germanium (Ge), boron (B), nitrogen (N) and hydrogen (H), in addition to Ta, Pd and O. Specific examples of the material containing the above element in addition to at least one of Ta and Pd, and O, include TaON, TaONH, PdON, PdONH, TaPdON, TaPdONH, TaHfO, TaHfON, TaBSiO and TaBSiON.

Among them, TaO, TaON or TaONH is preferred, whereby the absorber layer will be in an amorphous state, and the surface of the absorber layer will be excellent in the smoothness.

Further, TaPdO, TaPdON or TaPdONH is preferred, since not only the absorber layer will be in an amorphous state but also it has a low refractive index and a desired extinction coefficient, whereby the absorber layer can be made thin.

In this specification, the state represented by "being in an amorphous state" will be described later.

As described above, in a case where the low reflective layer 14 is formed on the absorber layer 13, the total thickness of them is preferably from 10, to 90, nm, more preferably from 15, to 87, nm, further preferably from 15, to 85, nm. Further, if the thickness of the low reflective layer 14 is larger than the thickness of the absorber layer 13, the EUV light absorption property of the absorber layer 13 may be reduced, and thus the thickness of the low reflective layer 14 is preferably smaller than the thickness of the absorber layer 13. Accordingly, the thickness of the low reflective layer 14 is preferably from 1, to 20, nm, more preferably from 1, to 15, nm, further preferably from 1 to 10, nm.

The low reflective layer 14 having the above construction may be formed by a known film-deposition method, e.g. a magnetron sputtering method or an ion beam sputtering method.

For example, in a case of forming a TaONH film by a magnetron sputtering method as the low reflective layer 14, it is preferably deposited to have a thickness of from 3, to 30, nm, by using a Ta target as a target and a mixed gas of Ar, $O_2$, $N_2$, and $H_2$ ($H_2$, gas concentration: 1, to 50, vol %, $O_2$, gas concentration: 1, to 80, vol %, $N_2$, gas concentration: 1, to 80, vol %, Ar gas concentration: 5, to 95, vol %, gas pressure: $1.0\times10^{-1}$ Pa to $50\times10^{-1}$, Pa) as a sputtering gas with an input power of from 30, to 3,000, W at a deposition rate of from 0.01, to 60, nm/min.

In a case where an inert gas other than Ar is used, the concentration of the inert gas is preferably set to be within the same concentration range as the above Ar gas concentration.

It is preferred to form the low reflective layer 14 on the absorber layer 13 in the EUV mask blank 1 of the present invention, because the wavelength of the pattern inspection light and the wavelength of the EUV light are different. Thus, in a case where EUV light (in the vicinity of 13.5, nm) is used as the pattern inspection light, it is considered that it is not necessary to form the low reflective layer 14 on the absorber layer 13. The wavelength of the inspection light tends to shift toward a short wavelength side along with a reduction in the pattern dimension, and it is considered to shift to 193, nm or further to 13.5, nm in future. Further, it is considered that it is not required to form the low reflective layer 14 on the absorber layer 13 when the wavelength of the inspection light is 193, nm. Further, it is considered that it is not required to form the low reflective layer 14 on the absorber layer 13 when the wavelength of the inspection light is 13.5, nm.

It is required for the hard mask layer 15 that the etching selectivity under etching conditions for the absorber layer 13 and the low reflective layer 14 is sufficiently high. In order to achieve this, the hard mask layer 15 is required to have sufficient etching resistance to etching conditions for the absorber layer 13 and the low reflective layer 14.

Usually, for etching of the absorber layer or the low reflective layer of an EUV mask blank, a chlorine type gas process or a fluorine type gas process is employed.

The low reflective layer 14 of the present invention contains at least one of Ta and Pd, and O, as the main components, and usually, a film containing oxygen has etching resistance in the chlorine type gas process, and it is easily etched in the fluorine type gas process.

The absorber layer 13 containing at least one of Ta and Pd as the main component in the present invention is also readily etched in the fluorine type gas process.

The etching properties of such a layer in the chlorine type gas process and the fluorine type gas process will be shown in the after-mentioned Examples.

Considering that the low reflective layer 14 containing at least one of Ta and Pd, and O, as the main components, has etching resistance in the chlorine type gas process, the hard mask layer 15 is preferably such that it is readily etched by the chlorine type gas process, and has high etching resistance in the fluorine type gas process. In such a case, by employing the fluorine type gas process for etching of the absorber layer 13 and the low reflective layer 14, the etching selectivity under the etching conditions for the absorber layer 13 and the low reflective layer 14 will be high. On the other hand, by employing the chlorine type gas process for etching of the hard mask layer 15, the etching selectivity as determined by the following formula will be high, and only the hard mask layer 15 will selectively be etched.

Etching selectivity (at the time of etching of the hard mask layer 15)=(the etching rate for the hard mask layer 15)/(the etching rate for the low reflective layer 14)

The above etching selectivity is specifically preferably at least 2.0,, more preferably at least 2.5,, further preferably at least 3.0.

Further, in the after-mentioned Example 3,, although a low reflective layer 14 is not formed on a TaPdN film as the absorber layer 13, as shown in Table 1,, the TaPdN film has etching resistance in the chlorine type gas process. On the other hand, etching is readily carried out in the fluorine type gas process.

Accordingly, by employing the fluorine type gas process for etching of the TaPdN film as the absorber layer 13, the etching selectivity under the etching conditions for the absorber layer 13 will be high. On the other hand, by employing the chlorine type gas process for etching of the hard mask layer 15, the etching selectivity as determined by the following formula will be high, and only the hard mask layer 15 can selectively be etched.

Etching selectivity (at the time of etching of the hard mask layer 15)=(the etching rate for the hard mask layer 15)/(the etching rate for the absorber layer 13)

The above etching selectivity is specifically preferably at least 4.0,, more preferably at least 4.5,, further preferably at least 5.0.

To achieve the above properties, the hard mask layer 15 is required to be constituted by a material having sufficiently high etching resistance in the fluorine type gas process and having a high etching rate in the chlorine type gas process.

Further, in the EUV mask blank of the present invention, the hard mask layer 15 is required to be in an amorphous state and have a sufficiently small surface roughness. If the hard mask layer is a crystalline film or a film having a large surface roughness, it is predicted that the line edge roughness after formation of a pattern will be large, and a pattern with a high resolution will not be obtained. Whereas, in a case where the hard mask layer 15 is in an amorphous state and has a sufficiently small surface roughness, the line edge roughness after formation of a pattern will not be large, and a pattern with a high resolution will be obtained.

The hard mask layer 15 of the EUV mask blank 1 of the present invention satisfies the above properties by containing the following elements in a specific proportion.

In the EUV mask blank 1 of the present invention, a first embodiment of the hard mask layer 15 is a CrNH film containing chromium (Cr), nitrogen (N) and hydrogen (H). In a case where the hard mask layer 15 is a CrNH film, the total content of Cr and N is from 85, to 99.9, at %, and the content of H is from 0.1, to 15, at %. If the content of H is less than 0.1, at %, the CrNH film will not be in an amorphous state, and the surface roughness of the CrNH film may be large. On the other hand, also in a case where the content of H is higher than 15, at %, the CrNH film will not be in an amorphous state, and the surface roughness of the CrNH film may be large. In a case where the hard mask layer 15 is a CrNH film, the compositional ratio (atomic ratio) of Cr to N is preferably Cr:N=9:1, to 3:7.

In a case where the hard mask layer 15 is a CrNH film, the content of H is more preferably from 0.1, to 13, at %, further preferably from 0.1, to 10, at %, particularly preferably from 0.1, to 8, at %. Further, the total content of Cr and N is more preferably from 87, to 99.9, at %, further preferably from 90, to 99.9, at %, particularly preferably from 92, to 99.9, at %. Further, the compositional ratio (atomic ratio) of Cr to N is preferably from 9:1, to 2.5:7.5,, more preferably from 8.5:1.5, to 2.5:7.5,, particularly preferably from 8:2, to 2.5:7.5.

A second embodiment of the hard mask layer 15 is a CrOH film containing chromium (Cr), oxygen (O) and hydrogen (H). In a case where the hard mask layer 15 is a CrOH film, the total content of Cr and O is from 15, to 99.9, at %, and the content of H is from 0.1, to 15, at %. If the content of H is less than 0.1, at %, the CrOH film will not be in an amorphous state, and the surface roughness of the CrOH film may be large. On the other hand, also in a case where the content of H is higher than 15 at %, the CrOH film will not be in an amorphous state, and the surface roughness of the CrOH film may be large. In a case where the hard mask layer 15 is a CrOH film, the compositional ratio (atomic ratio) of Cr to O is preferably Cr:O=9:1, to 3:7.

In a case where the hard mask layer 15 is a CrOH film, the content of H is more preferably from 0.1, to 13, at %, further preferably from 0.1, to 10, at %, particularly preferably from 0.1, to 8, at %. Further, the total content of Cr and O is more preferably from 87, to 99.9, at %, further preferably from 90, to 99.9, at %, particularly preferably from 92, to 99.9, at %. Further, the compositional ratio (atomic ratio) of Cr to O is preferably from 9:1, to 2.5:7.5,, more preferably from 8.5:1.5, to 2.5:7.5,, particularly preferably from 8:2, to 2.5:7.5.

The hard mask layer 15 (i.e. the CrNH film or the CrOH film) is in an amorphous state by having the above constitution. In this specification, "in an amorphous state" means not only a state of amorphous structure having no crystal structure at all but also a state of a microcrystal structure.

By the hard mask layer 15 (CrNH film, CrOH film) being a film having an amorphous structure or a film having a microcrystal structure, the surface roughness of the hard mask layer 15 is small. The surface roughness (rms) of the hard mask layer 15 is preferably at most 0.5, nm. The surface roughness of the hard mask layer 15 can be measured by an atomic force microscope. If the surface roughness of the hard mask layer 15 is large, the edge roughness of a pattern to be formed on the hard mask layer 15 tends to be large, whereby the dimension accuracy of the pattern may deteriorate. As the pattern becomes fine, the influence of the edge roughness tends to be distinct, and accordingly the surface of the hard mask layer 15 is required to be smooth.

When the surface roughness (rms) of the hard mask layer 15 is at most 0.5, nm, the surface of the hard mask layer 15 is sufficiently smooth, and thus the dimension accuracy of the pattern will not deteriorate due to the influence of the edge roughness. The surface roughness (rms) of the hard mask layer 15 is more preferably at most 0.4 nm, further preferably at most 0.3, nm.

Whether the hard mask layer 15 (CrNH film, CrOH film) is in an amorphous state, i.e. in a state of amorphous structure or microcrystal structure, may be confirmed by an X-ray diffraction (XRD) method. When the hard mask layer 15 has an amorphous structure or a microcrystal structure, no sharp peak will be observed among the diffraction peaks obtained by the XRD measurement.

If the hard mask layer 15 is a film having a crystalline structure, also from reasons that etching will selectively proceed only in a specific crystal orientation, the edge roughness of the pattern to be formed on the hard mask layer 15 will be large, whereby the dimension accuracy of the pattern may deteriorate.

Also from such a reason, the hard mask layer 15 (CrNH film, CrOH film) is preferably in an amorphous state.

The film thickness of the hard mask layer 15 is preferably from 2, to 28, nm, more preferably from 2, to 25, nm.

The above hard mask layer 15 (CrNH film, CrOH film) may be formed by a known film-deposition method, for example, a sputtering method such as a magnetron sputtering method or an ion beam sputtering method. In a case where the hard mask layer 15 (CrNH film, CrOH film) is to be formed by a sputtering method, sputtering may be carried out using a Cr target in an atmosphere containing an inert gas including at least one member selected from the group consisting of helium (He), argon (Ar), neon (Ne), krypton (Kr) and xenon (Xe), either one of oxygen ($O_2$) and nitrogen ($N_2$), and hydrogen ($H_2$). In a case where the magnetron sputtering method is employed, it is carried out specifically under the following deposition conditions.

[Method of Forming Hard Mask Layer (in the Case of CrNH Film)]

Sputtering gas: mixed gas of Ar, $N_2$, and $H_2$, ($H_2$, gas concentration: 1, to 50, vol %, preferably 1, to 30, vol %, $N_2$, gas concentration: 1, to 80, vol %, preferably 5, to 75, vol %, Ar gas concentration: 5, to 95, vol %, preferably 10, to 94, vol %, gas pressure: $1.0 \times 10^{-1}$ Pa to $30 \times 10^{-1}$, Pa)

Input power: 30, to 3,000, W, preferably 100, to 3,000, W, more preferably 500, to 3,000, W Deposition rate: 0.5, to 60, nm/min, preferably 1.0, to 45, nm/min, more preferably 1.5, to 30, nm/min

[Method of Forming Hard Mask Layer (in the Case of CrOH Film)]

Sputtering gas: mixed gas of Ar, $O_2$, and $H_2$, ($H_2$, gas concentration: 1, to 50, vol %, preferably 1, to 30, vol %, $O_2$, gas concentration: 1, to 80, vol %, preferably 5, to 75, vol %, Ar gas concentration: 5, to 95, vol %, preferably 10, to 94, vol %, gas pressure: $1.0 \times 10^{-1}$, Pa to $50 \times 10^{-1}$, Pa, preferably $1.0 \times 10^{-1}$, Pa to $40 \times 10^{-1}$, Pa, more preferably $1.0 \times 10^{-1}$, Pa to $30 \times 10^{-1}$, Pa)

Input power: 30, to 3,000, W, preferably 100, to 3,000, W, more preferably 500, to 3,000, W Deposition rate: 0.5, to 60, nm/min, preferably 1.0, to 45, nm/min, more preferably 1.5, to 30, nm/min In a case where an inert gas other than Ar is used, the concentration of the inert gas is preferably set to be within the same concentration range as the above Ar gas concentration. Further, in a case where a plurality of types of inert gases is used, the total concentration of the inert gases is preferably set to be within the same concentration range as the above Ar gas concentration.

The EUV mask blank 1 of the present invention may have a functional film known in the field of the EUV mask blank, in addition to the reflective layer 12, the absorber layer 13, the low reflective layer 14 and the hard mask layer 15 and the protection layer formed as the case requires. Specific examples of such a functional film include a highly dielectric coating to be applied on the back side of the substrate to accelerate electrostatic chucking of the substrate as disclosed in JP-A-2003-501823. Here, the back side of the substrate is meant for a face opposite to the face on which the reflective layer 12 is formed in the substrate 11 in FIG. 1. The electrical conductivity of a constituent material and the thickness of the highly dielectric coating to be applied on the back side of the substrate for the above purpose are selected so that the sheet resistance will be at most 100, $\Omega/\square$. As the constituent material of the highly dielectric coating can be widely selected from ones disclosed in known literature. For example, a highly dielectric coating as disclosed in JP-A-2003-501823,, specifically, a coating comprising silicon, TiN, molybdenum, chromium or TaSi can be applied. The thickness of the highly dielectric coating may, for example, be from 10, to 1,000, nm.

The highly dielectric coating can be formed by a known film-deposition method, e.g. a sputtering method such as a magnetron sputtering method or an ion beam sputtering method, a CVD method, a vacuum deposition method or an electrolytic plating method.

Figure 2:
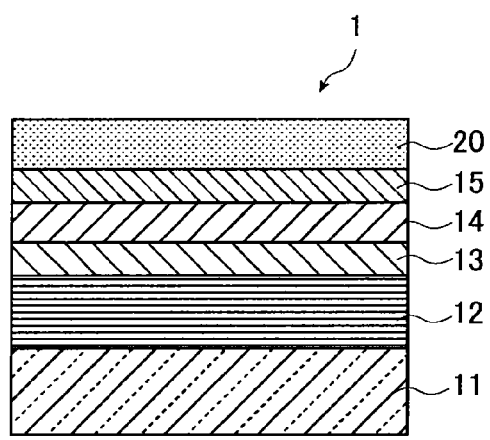
FIG. 2 is a view illustrating the procedure for forming a pattern on the EUV mask blank 1 shown in FIG. 1, and illustrates a state where a resist film 20 is formed on a hard mask layer 15 of the EUV mask blank 1.
Figure 3:
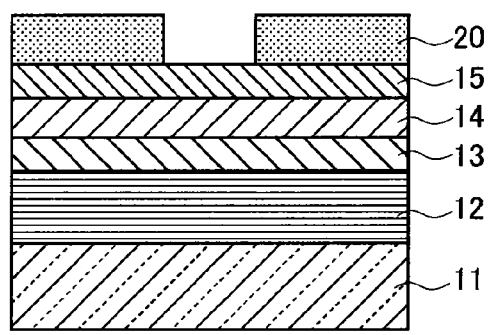
FIG. 3 is a view illustrating the procedure following the procedure shown in FIG. 2, and illustrates a state where a pattern is formed on the resist film 20.
Figure 4:
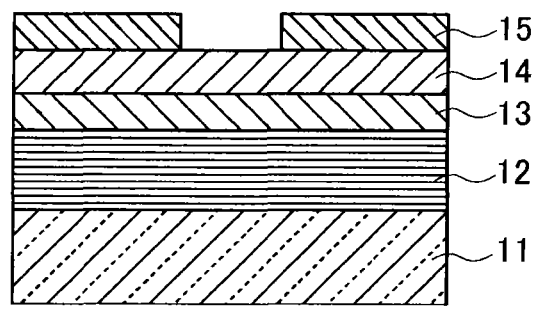
FIG. 4 is a view illustrating the procedure following the procedure shown in FIG. 3, and illustrates a state where a pattern is formed on the hard mask layer 15.
Figure 5:
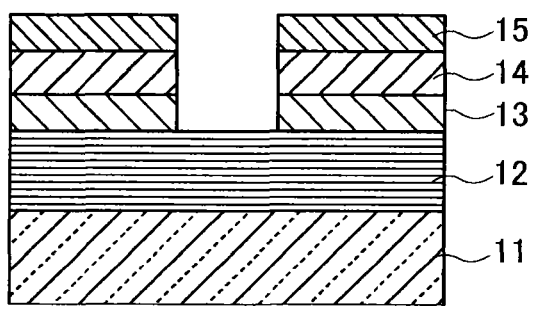
FIG. 5 is a view illustrating the procedure following the procedure shown in FIG. 4, and illustrates a state where a pattern is formed on an absorber layer 13 and a low reflective layer 14.
Figure 6:
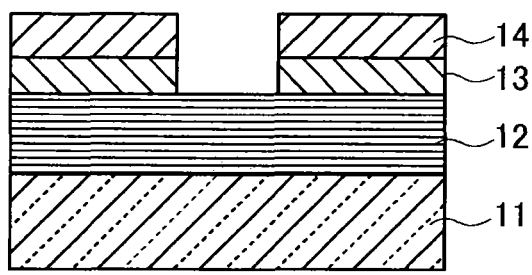
FIG. 6 is a view illustrating the procedure following the procedure shown in FIG. 5, and illustrates a state where the hard mask layer 15 is removed.

Now, the procedure for forming a pattern on the EUV mask blank of the present invention will be described with reference to FIGS. 2 to 6. In a case where a pattern is formed on the EUV mask blank of the present invention, as shown in FIG. 2, a resist film 20 is formed on the hard mask layer 15 of an EUV mask blank 1, and a pattern is formed on the resist film 20 as shown in FIG. 3 using an electron beam lithography apparatus. Then, using the resist film having a pattern formed thereon as the mask, a pattern is formed on the hard mask layer 15 as shown in FIG. 4. FIG. 4 illustrates a state where the resist film 20 is removed after a pattern is formed on the hard mask layer 15. For formation of a pattern on the hard mask layer 15, etching by a chlorine type gas process may be carried out. Then, using the hard mask layer 15 having a pattern formed thereon as the mask, as shown in FIG. 5, a pattern is formed on an absorber layer 13 and a low reflective layer 14. For formation of a pattern on the absorber layer 13 and the low reflective layer 14, etching by a fluorine type gas process may be carried out. Then, as shown in FIG. 6, the hard mask layer 15 is removed. To remove the hard mask layer 15, etching by a chlorine type gas process may be carried out.

EXAMPLES

Now, the present invention will be described in further detail with reference to Examples.

Example 1

In this Example, an EUV mask blank 1 shown in FIG. 1 was prepared. Between a reflective layer 12 and an absorber layer 13, a protection layer was formed.

As a substrate 11 for film deposition, a $SiO_2$-$TiO_2$, glass substrate (outer dimensions of 6, inch (152, mm) square and a thickness of 6.3, mm) was used. This glass substrate has a thermal expansion coefficient of $0.05 \times 10^{-7}$/° C. at 20° C., a Young's modulus of 67, GPa, a Poisson's ratio of 0.17, and a specific rigidity of $3.07 \times 10^7$, $m^2/s^2$. The glass substrate was polished so as to have a smooth surface with a surface roughness (rms) of at most 0.15, nm and a flatness of at most 100, nm.

On the back side of the substrate 11, a highly dielectric coating with a sheet resistance of 100, Ω/□ was applied by depositing a Cr film with a thickness of 100, nm by a magnetron sputtering method.

The substrate 11 was fixed to a common electrostatic chuck in a flat plate shape via the formed Cr film, and a cycle comprising alternately depositing Si films and Mo films on the surface of the substrate 11 by an ion beam sputtering method was repeated 40, cycles to form a Mo/Si multilayer reflective film (reflective layer 12) having a total film thickness of 272, nm ((4.5, nm (Si film)+2.3, nm (Mo film))×40), having a Si film as the undermost layer on the substrate side.

Further, on the Mo/Si multilayer reflective film (reflective layer 12), a Ru film (thickness: 2.5, nm) was formed by using an ion beam sputtering method to form a protection layer.

The deposition conditions for the Si films, the Mo films and the Ru film are as follows.
[Deposition Conditions for Si Films]
 Target: Si target (doped with boron)
 Sputtering gas: Ar gas (gas pressure 0.02, Pa)
 Voltage: 700, V
 Deposition rate: 0.077, nm/sec
 Film thickness: 4.5, nm
[Deposition Conditions for Mo Films]
 Target: Mo target
 Sputtering gas: Ar gas (gas pressure 0.02, Pa)
 Voltage: 700, V
 Deposition rate: 0.064, nm/sec
 Film thickness: 2.3, nm
[Deposition Conditions for Ru Film]
 Target: Ru target
 Sputtering gas: Ar gas (gas pressure: 0.02, Pa)
 Voltage: 500, V
 Deposition rate: 0.023, nm/sec
 Film thickness: 2.5, nm Then, on the protection layer, an absorber layer 13 containing Ta, N and H (TaNH film) was formed by a magnetron sputtering method. The deposition conditions for the absorber layer 13 are as follows. The compositional ratio (atomic ratio) of the absorber layer 13 was Ta:N:H=55:39:6, as analyzed by an apparatus and a measurement method employed for the after-mentioned analysis of a hard mask layer.
[Deposition Conditions for Absorber Layer 13 (TaNH Film)]
 Target: Ta target
 Sputtering gas: mixed gas of Ar, $N_2$, and $H_2$, (Ar: 89, vol %, $N_2$: 8.3, vol %, $H_2$: 2.7 vol %, gas pressure: 0.46, Pa)
 Input power: 300, W
 Deposition rate: 1.5, nm/min
 Film thickness: 70, nm Then, on the absorber layer 13 (TaNH film), the low reflective layer 14 containing Ta, O, N and H (TaONH film) was formed. The deposition conditions for the low reflective layer 14 (TaONH film) are as follows. The compositional ratio (atomic ratio) of the absorber layer 13 was Ta:O:N:H=22:65:5:8, as analyzed by an apparatus and a measurement method employed for the after-mentioned analysis of a hard mask layer.
[Deposition Conditions for Low Reflective Layer 14 (TaONH Film)]
 Target: Ta target
 Sputtering gas: mixed gas of Ar, $O_2$, $N_2$, and $H_2$, (Ar: 48, vol %, $O_2$: 36, vol %, $N_2$: 14 vol %, $H_2$: 2, vol %, gas pressure: 0.3, Pa)
 Input power: 450, W
 Deposition rate: 1.5, nm/min
 Film thickness: 10, nm Then, on the low reflective layer 14, a hard mask layer 15 containing Cr, N and H (CrNH film) was formed by a magnetron sputtering method to obtain an EUV mask blank 1 comprising the substrate 11, and the reflective layer 12, the protection layer, the absorber layer 13, the low reflective layer 14 and the hard mask layer 15 formed in this order on the substrate 11.

The deposition conditions for the hard mask layer 15 are as follows.
[Deposition Conditions for Hard Mask Layer 15 (CrNH Film)]
 Target: Cr target
 Sputtering gas: mixed gas of Ar, $N_2$, and $H_2$, (Ar: 89, vol %, $N_2$: 8.3, vol %, $H_2$: 2.7 vol %, gas pressure: 0.46, Pa)
 Input power: 2,000, W
 Deposition rate: 5.5, nm/min
 Film thickness: 20, nm With respect to the hard mask layer 15 (CrNH film) of the EUV mask blank 1 obtained by the above procedure, the following evaluations (1) to (4) were carried out.
(1) Film Composition The composition of the hard mask layer 15 (CrNH film) was measured by an X-ray photoelectron spectrometer (manufactured by PERKIN ELMER-PHI), a secondary ion mass spectrometer (manufactured by PHI-ATOMIKA) and a Rutherform Backscattering Spectroscopy (manufactured by Kobe Steel Ltd. The compositional ratio (at %) of the hard mask layer 15 (CrNH film) is Cr:N:H=55:39:6, (the Cr content was 55, at %, the N content was 39, at %, and the H content was 6, at %).
(2) State The state of the hard mask layer 15 (CrNH film) was confirmed by an X-ray diffractometer (manufactured by RIGAKU Corporation). The hard mask layer 15 (CrNH film) was confirmed to have an amorphous structure or a microcrystal structure, since no sharp peak was observed among the diffraction peaks obtained.
(3) Surface Roughness The surface roughness of the hard mask layer 15 (CrNH film) was measured by an atomic force microscope (SPI-3800,, manufactured by Seiko Instruments Inc.) in dynamic force mode. The area for measurement for surface roughness is 1, μm×1 μm, and SI-DF40, (manufactured by Seiko Instruments Inc.) was used as a cantilever. The surface roughness (rms) of the hard mask layer 15 was 0.35, nm.

(4) Etching Properties

With respect to the etching properties, evaluation was conducted by the following method instead of evaluation using the EUV mask blank 1 prepared by the above procedure.

On a sample table (4-inch quartz substrate) of an RF plasma etching apparatus, a Si chip (10, mm×30, mm) having an absorber layer 13 (TaNH film), a low reflective layer 14 (TaONH film) and a hard mask layer 15 (CrNH film) respectively deposited under the same conditions as above, was placed as a sample. To the above sample, plasma RF etching was carried out by the following chlorine type gas process and fluorine type process.

[Chlorine Type Gas Process]
 Bias RF: 50, W
 Etching time: 120, sec
 Trigger pressure: 3, Pa
 Etching pressure: 0.3, Pa
 Etching gas: $Cl_2$/He
 Gas flow rate ($Cl_2$/Ar):4/16, sccm
 Distance between electrode and substrate: 55, mm

[Fluorine Type Gas Process]
 Bias RF: 50, W
 Etching time: 120, sec
 Trigger pressure: 3, Pa
 Etching pressure: 0.3, Pa
 Etching gas: $CF_4$/He
 Gas flow rate ($CF_4$/He):4/16, sccm
 Distance between electrode and substrate: 55, mm In Table 1,, the obtained etching rates for the TaNH film, the TaONH film and the CrNH film are shown. In the case of the fluorine type gas process, the film reduction of the CrNH film after etching could not be confirmed, and the etching rate was N.D. That is, the CrNH film has high etching resistance in the fluorine type gas process to be employed for etching of the absorber layer 13 (TaNH film) and the low reflective layer 14, and has a sufficiently high etching selectivity under the etching conditions for the absorber layer 13 (TaNH film) and the low reflective layer 14 (TaONH film).

On the other hand, the CrNH film showed a sufficiently high etching rate in the chlorine type gas process to be employed for etching of the hard mask layer 15. With respect to the chlorine type gas process, the etching selectivity of the CrNH film to the TaONH film was calculated based on the following formula.

Etching selectivity=(the etching rate for the CrNH film)/(the etching rate for the TaONH film)

The etching selectivity as calculated from the above formula was 3.3,, and it was confirmed that a sufficient etching selectivity was secured.

Example 2

In Example 2,, an EUV mask blank was prepared in the same manner as in Example 1, except that the hard mask layer 15 was a CrOH film. The CrOH film was deposited under the following conditions.

[Deposition Conditions for Hard Mask Layer 15 (CrOH Film)]
 Target: Cr target
 Sputtering gas: mixed gas of Ar, $O_2$, and $H_2$, (Ar: 89, vol %, $O_2$: 8.3, vol %, $H_2$: 2.7 vol %, gas pressure: 0.46, Pa)
 Input power: 2,000, W
 Deposition rate: 5.5, nm/min
 Film thickness: 20, nm With respect to the hard mask layer 15 (CrOH film) of the EUV mask blank obtained by the above procedure, the following evaluations (1) to (4) were carried out.

(1) Film Composition

The composition of the hard mask layer 15 (CrOH film) was measured by the same method as in Example 1, and as a result, it was CrO:H=55:39:6, (the Cr content was 55, at %, the O content was 39, at %, and the H content was 6, at %).

(2) State

The state of the hard mask layer 15 (CrOH film) was measured in the same manner as in Example 1, and as a result, the hard mask layer 15 (CrOH film) was confirmed to have an amorphous structure or a microcrystal structure, since no sharp peak was observed among the diffraction peaks obtained.

(3) Surface Roughness

The surface roughness of the hard mask layer 15 (CrOH film) was measured in the same manner as in Example 1, and as a result, it was 0.40, nm.

(4) Etching Properties

With respect to the etching properties, the results measured in the same manner as in Example 1, were shown in Table 1. In the case of the fluorine type gas process, the film reduction of the CrOH film after etching was not confirmed, and the etching rate was N.D. That is, the CrOH film has high etching resistance in the fluorine type gas process employed for etching of the absorber layer 13 (TaNH film) and the low reflective layer 14, and has a sufficiently high etching selectivity under the etching conditions for the absorber layer 13 (TaNH film) and the low reflective layer 14 (TaONH film).

On the other hand, the CrOH film had a sufficiently high etching rate in the chlorine type gas process employed for etching of the hard mask layer 15. With respect to the chlorine type gas process, the etching selectivity of the CrOH film to the TaONH film was calculated based on the following formula.

Etching selectivity=(the etching rate for the CrOH film)/(the etching rate for the TaONH film)

The etching selectivity as calculated from the above formula was 9.7,, and it was confirmed that a sufficient etching selectivity was secured.

Example 3

In Example 3,, EUV mask blanks were prepared in the same manner as in Examples 1, and 2, except that a TaPdN film was formed as the absorber layer 13, and no low reflective layer 14 was formed, and of these EUV mask blanks, the etching properties were evaluated in the same manner as above. That is, the etching selectivity of the absorber layer 13 (TaPdN film) to the hard mask layer 15 (CrNH film or CrOH film) was compared. The TaPdN film was deposited under the following conditions. The compositional ratio (atomic ratio) of the absorber layer 13 was analyzed by the same apparatus and the same measurement method as in Example 1 and as a result, Pd:Ta:N=80:15:5.

[Deposition Conditions for Absorber Layer 13 (TaPdN Film)]
 Target: Ta target and Pd target
 Sputtering gas: mixed gas of Ar and $N_2$, (Ar: 86, vol %, $N_2$: 14, vol %, gas pressure: 0.3, Pa)
 Input power: Ta target=150, W, Pd target 75, W
 Deposition rate: 19.1, nm/min
 Film thickness: 50, nm In Table 1, the etching rate for the TaPdN film measured in the same manner as in Example 1, is shown. In the case of the fluorine type gas process, the etching rate for the absorber layer 13 (TaPdN film) was 4.0, nm/min. On the other hand, as disclosed in Examples 1, and 2,, since the CrNH film and the CrOH film have high etching resistance in the fluorine type gas process, its etching selectivity under the etching conditions for the absorber layer 13 (TaPdN film) is sufficiently high.

On the other hand, with respect to the chlorine type gas process, the etching selectivities of the CrNH film and the CrOH film to the TaPdN film were calculated based on the following formulae.

Etching selectivity (in the case of the CrNH film)=(the etching rate for the CrNH film)/(the etching rate for the TaPdN film)

Etching selectivity (in the case of the CrOH film)=(the etching rate for the CrOH film)/(the etching rate for the TaPdN film)

The etching selectivity to the TaPdN film as calculated from the above formulae was 6.2, in the case of the CrNH film and 18.3, in the case of the CrOH film, and it was confirmed that sufficiently high etching selectivities were secured.

TABLE 1

| | Etching rate (nm/min) | |
|---|---|---|
| | Chlorine type gas process | Fluorine type gas process |
| TaNH film | 46.7 | 14.9 |
| TaONH film | 4.7 | 14.9 |
| TaPdN film | 2.5 | 4.0 |
| CrNH film | 15.6 | N.D. |
| CrOH film | 45.7 | N.D. |

Comparative Example 1

In Comparative Example 1,, an EUV mask blank was prepared in the same manner as in Example 1, except that a CrN film containing no hydrogen was formed as the hard mask layer 15. The CrN film was deposited under the following conditions.

[Deposition Conditions for Hard Mask Layer 15 (CrN Film)]
Target: Cr target
Sputtering gas: mixed gas of Ar and $N_2$, (Ar: 89, vol %, $N_2$: 11, vol %, gas pressure: 0.46, Pa)
Input power: 2,000, W
Deposition rate: 5.5, nm/min
Film thickness: 20, nm The film composition of the hard mask layer 15 (CrN film) of the EUV mask blank obtained by the above procedure was measured in the same manner as in Example 1 and as a result, Cr:N=55:45, (the Cr content was 55, at %, and the N content was 45 at %).

Further, the state of the hard mask layer 15 (CrN film) was measured in the same manner as in Example 1, and as a result, the hard mask layer 15 (CrN film) was confirmed to have a crystalline structure since a sharp peak was observed among the diffraction peaks obtained.

Further, the surface roughness of the hard mask layer 15 (CrN film) was measured in the same manner as in Example 1, and as a result, the surface roughness (rms) was 0.65, nm.

Since the CrN film in this Comparative Example has a crystalline structure and a large surface roughness, it is predicted that the line edge roughness at the time of forming a pattern is large, and accordingly it is not preferred as a hard mask layer of an EUV mask blank.

Comparative Example 2

In Comparative Example 2,, an EUV mask blank was prepared in the same manner as in Example 1, except that a CrNH film having a hydrogen content higher than 15, at % was formed as the hard mask layer 15. The CrNH film was deposited under the following conditions.

[Deposition Conditions for Hard Mask Layer 15 (CrNH film)]
Target: Cr target
Sputtering gas: mixed gas of Ar, $N_2$, and $H_2$, (Ar: 80, vol %, $N_2$: 5, vol %, $H_2$: 15 vol %, gas pressure: 0.46, Pa)
Input power: 2,000, W
Deposition rate: 4.0, nm/min
Film thickness: 20, nm The film composition of the hard mask layer 15 (CrNH film) of the EUV mask blank obtained by the above procedure was measured in the same manner as in Example 1, and as a result, Cr:N:H=54:30:16, (the Cr content was 54, at %, the N content was 30, at %, and the H content was 16, at %).

Further, the state of the hard mask layer 15 (CrNH film) was measured in the same manner as in Example 1, and as a result, the hard mask layer 15 (CrNH film) was confirmed to have a crystalline structure since a sharp peak was observed among the diffraction peaks obtained.

Further, the surface roughness of the hard mask layer 15 (CrNH film) was measured in the same manner as in Example 1, and as a result, the surface roughness (rms) was 0.70, nm.

Since the CrNH film in this Comparative Example has a crystalline structure and a large surface roughness, it is predicted that the line edge roughness at the time of forming a pattern is large, and accordingly it is not preferred as a hard mask layer of an EUV mask blank.

Comparative Example 3

In Comparative Example 3,, an EUV mask blank was prepared in the same manner as in Example 2, except that a CrO film containing no hydrogen was formed as the hard mask layer 15. The CrO film was deposited under the following conditions.

[Deposition Conditions for Hard Mask Layer 15 (CrO Film)]
Target: Cr target
Sputtering gas: mixed gas of Ar and $O_2$, (Ar: 89, vol %, $O_2$: 11, vol %, gas pressure: 0.46, Pa)
Input power: 2,000, W
Deposition rate: 5.5, nm/min
Film thickness: 20, nm The film composition of the hard mask layer 15 (CrO film) of the EUV mask blank obtained by the above procedure was measured in the same manner as in Example 1 and as a result, Cr:O=55:45, (the Cr content was 55, at %, and the N content was 45 at %).

Further, the state of the hard mask layer 15 (CrO film) was measured in the same manner as in Example 1, and as a result, the hard mask layer 15 (CrO film) was confirmed to have a crystalline structure since a sharp peak was observed among the diffraction peaks obtained.

Further, the surface roughness of the hard mask layer 15 (CrO film) was measured in the same manner as in Example 1, and as a result, the surface roughness (rms) was 0.65, nm.

Since the CrO film in this Comparative Example has a crystalline structure and a large surface roughness, it is predicted that the line edge roughness at the time of forming a pattern is large, and accordingly it is not preferred as a hard mask layer of an EUV mask blank.

Comparative Example 4

In Comparative Example 4,, an EUV mask blank was prepared in the same manner as in Example 1, except that a CrOH film having a hydrogen content higher than 15, at % was formed as the hard mask layer 15. The CrOH film was deposited under the following conditions.
[Deposition Conditions for Hard Mask Layer 15 (CrOH Film)]
  Target: Cr target
  Sputtering gas: mixed gas of Ar, $O_2$, and $H_2$, (Ar: 80, vol %, $O_2$: 5, vol %, $H_2$: 15 vol %, gas pressure: 0.46, Pa)
  Input power: 2,000, W
  Deposition rate: 4.2, nm/min
  Film thickness: 20, nm The film composition of the hard mask layer 15 (CrOH film) of the EUV mask blank obtained by the above procedure was measured in the same manner as in Example 1, and as a result, CEO:H=54:30:16, (the Cr content was 54, at %, the O content was 30, at %, and the H content was 16, at %).

Further, the state of the hard mask layer 15 (CrOH film) was measured in the same manner as in Example 1, and as a result, the hard mask layer 15 (CrOH film) was confirmed to have a crystalline structure since a sharp peak was observed among the diffraction peaks obtained.

Further, the surface roughness of the hard mask layer 15 (CrOH film) was measured in the same manner as in Example 1, and as a result, the surface roughness (rms) was 0.75, nm.

Since the CrOH film in this Comparative Example has a crystalline structure and a large surface roughness, it is predicted that the line edge roughness at the time of forming a pattern is large, and accordingly it is not preferred as a hard mask layer of an
Industrial Applicability According to the reflective mask blank for EUV lithography of the present invention, the reduction in the thickness of a resist film which is required to obtain a pattern with a high resolution can be achieved, and further, the line edge roughness after formation of a pattern will not be large, whereby a pattern with a high resolution can obtained, and it is useful as a reflective mask blank for EUV lithography.

This application is a continuation of PCT Application No. PCT/JP2012/052012, filed on Jan. 30, 2012,, which is based upon and claims the benefit of priority from Japanese Patent Application No. 2011-019391, filed on Feb. 1, 2011. The contents of those applications are incorporated herein by reference in its entirety.

REFERENCE SYMBOLS

1: EUV mask blank
11: substrate
12: reflective layer (multilayer reflective film)
13: absorber layer
14: low reflective layer
15: hard mask layer
20: resist film

What is claimed is:

1. A reflective mask blank for EUV lithography comprising a substrate, and a reflective layer for reflecting EUV light, an absorber layer for absorbing EUV light and a hard mask layer formed in this order on the substrate;
   wherein the absorber layer contains at least one of tantalum (Ta) and palladium (Pd) as the main component;
   the hard mask layer contains chromium (Cr), nitrogen (N) and hydrogen (H); and
   in the hard mask layer, the total content of Cr and N is from 85, to 99.9, at %, and the content of H is from 0.1, to 15, at %.

2. A reflective mask blank for EUV lithography comprising a substrate, and a reflective layer for reflecting EUV light, an absorber layer for absorbing EUV light, a low reflective layer for inspection light (wavelength: 190, to 260, nm) for a mask pattern, and a hard mask layer formed in this order on the substrate;
   wherein the absorber layer contains at least one of tantalum (Ta) and palladium (Pd) as the main component;
   the low reflective layer contains at least one of tantalum (Ta) and palladium (Pd), and oxygen (O), as the main components;
   the hard mask layer contains chromium (Cr), nitrogen (N) and hydrogen (H); and
   in the hard mask layer, the total content of Cr and N is from 85, to 99.9, at %, and the content of H is from 0.1, to 15, at %.

3. The reflective mask blank for EUV lithography according to claim 1, wherein in the hard mask layer, the compositional ratio (atomic ratio) of Cr to N is Cr:N=9:1, to 3:7.

4. The reflective mask blank for EUV lithography according to claim 2, wherein in the hard mask layer, the compositional ratio (atomic ratio) of Cr to N is Cr:N=9:1, to 3:7.

5. The reflective mask blank for EUV lithography according to claim 1, wherein the hard mask layer is formed by a sputtering method using a Cr target in an atmosphere containing an inert gas including at least one member selected from the group consisting of helium (He), argon (Ar), neon (Ne), krypton (Kr) and xenon (Xe), and nitrogen ($N_2$) and hydrogen ($H_2$).

6. The reflective mask blank for EUV lithography according to claim 2, wherein the hard mask layer is formed by a sputtering method using a Cr target in an atmosphere containing an inert gas including at least one member selected from the group consisting of helium (He), argon (Ar), neon (Ne), krypton (Kr) and xenon (Xe), and nitrogen ($N_2$) and hydrogen ($H_2$).

7. A reflective mask blank for EUV lithography comprising a substrate, and a reflective layer for reflecting EUV light, an absorber layer for absorbing EUV light and a hard mask layer formed in this order on the substrate;
   wherein the absorber layer contains at least one of tantalum (Ta) and palladium (Pd) as the main component;
   the hard mask layer contains chromium (Cr), oxygen (O) and hydrogen (H); and
   in the hard mask layer, the total content of Cr and O is from 85, to 99.9, at %, and the content of H is from 0.1, to 15, at %.

8. A reflective mask blank for EUV lithography comprising a substrate, and a reflective layer for reflecting EUV light, an absorber layer for absorbing EUV light, a low reflective layer for inspection light (wavelength:190, to 260, nm) for a mask pattern, and a hard mask layer formed in this order on the substrate;
   wherein the absorber layer contains at least one of tantalum (Ta) and palladium (Pd) as the main component;
   the low reflective layer contains at least one of tantalum (Ta) and palladium (Pd), and oxygen (O), as the main components;
   the hard mask layer contains chromium (Cr), oxygen (O) and hydrogen (H); and in the hard mask layer, the total content of Cr and O is from 85, to 99.9, at %, and the content of H is from 0.1, to 15, at %.

9. The reflective mask blank for EUV lithography according to claim 7, wherein in the hard mask layer, the compositional ratio (atomic ratio) of Cr to O is Cr:O=9:1, to 3:7.

10. The reflective mask blank for EUV lithography according to claim 8, wherein in the hard mask layer, the compositional ratio (atomic ratio) of Cr to O is Cr:O=9:1, to 3:7.

11. The reflective mask blank for EUV lithography according to claim 7, wherein the hard mask layer is formed by a sputtering method using a Cr target in an atmosphere containing an inert gas including at least one member selected from the group consisting of helium (He), argon (Ar), neon (Ne), krypton (Kr) and xenon (Xe), and oxygen ($O_2$) and hydrogen ($H_2$).

12. The reflective mask blank for EUV lithography according to claim 8, wherein the hard mask layer is formed by a sputtering method using a Cr target in an atmosphere containing an inert gas including at least one member selected from the group consisting of helium (He), argon (Ar), neon (Ne), krypton (Kr) and xenon (Xe), and oxygen ($O_2$) and hydrogen ($H_2$).

13. The reflective mask blank for EUV lithography according to claim 1, wherein the hard mask layer is in an amorphous state.

14. The reflective mask blank for EUV lithography according to claim 7, wherein the hard mask layer is in an amorphous state.

15. The reflective mask blank for EUV lithography according to claim 1, wherein the surface roughness (rms) of the surface of the hard mask layer is at most 0.5, nm.

16. The reflective mask blank for EUV lithography according to claim 7, wherein the surface roughness (rms) of the surface of the hard mask layer is at most 0.5, nm.

17. The reflective mask blank for EUV lithography according to claim 1, wherein the hard mask layer has a film thickness of from 2, to 30, nm.

18. The reflective mask blank for EUV lithography according to claim 7, wherein the hard mask layer has a film thickness of from 2, to 30, nm.

19. The reflective mask blank for EUV lithography according to claim 1, wherein between the reflective layer and the absorber layer, a protection layer to protect the reflective layer at the time of forming a pattern on the absorber layer is formed, and the protection layer is formed by at least one member selected from the group consisting of Ru, a Ru compound, $SiO_2$, and a Cr compound.

20. The reflective mask blank for EUV lithography according to claim 7, wherein between the reflective layer and the absorber layer, a protection layer to protect the reflective layer at the time of forming a pattern on the absorber layer is formed, and the protection layer is formed by at least one member selected from the group consisting of Ru, a Ru compound, $SiO_2$, and a Cr compound.

* * * * *